United States Patent [19]
Dangelo et al.

[11] Patent Number: 5,907,494
[45] Date of Patent: May 25, 1999

[54] COMPUTER SYSTEM AND METHOD FOR PERFORMING DESIGN AUTOMATION IN A DISTRIBUTED COMPUTING ENVIRONMENT

[75] Inventors: J. Carlos Dangelo, Los Gatos; Vijay Nagasamy, Fremont, both of Calif.

[73] Assignee: LSI Logic Corporation, Milpitas, Calif.

[21] Appl. No.: 08/754,142

[22] Filed: Nov. 22, 1996

[51] Int. Cl.⁶ ..................................................... G06F 15/60
[52] U.S. Cl. .......................... 364/488; 364/489; 364/490; 364/491; 395/500
[58] Field of Search .................................. 364/488, 489, 364/490; 395/500

[56] References Cited

U.S. PATENT DOCUMENTS

| | | | |
|---|---|---|---|
| 5,197,016 | 3/1993 | Sugimoto et al. | 364/490 |
| 5,201,046 | 4/1993 | Goldberg et al. | 395/600 |
| 5,526,517 | 6/1996 | Jones et al. | 395/600 |
| 5,553,002 | 9/1996 | Dangelo et al. | 364/489 |

*Primary Examiner*—Kevin J. Teska
*Assistant Examiner*—Thuan Do

[57] ABSTRACT

A machine-independent operating environment, method and storage medium embodying machine-code usable by a computer system for exchanging design information between a plurality of computer-aided design tools. A set of data format objects are provided for exchanging the design information between each computer aided-design tool. An accessing method is provided for enabling each computer-aided design tool to store the design information into and retrieve the design information from an associated data format object. An archiving method is provided for enabling the computer system to write the data format objects storing the design information onto and read the data format objects storing the design information from a storage device interconnected with the computer system using each associated data format object. Preferably, each computer-aided design tool is expressed in machine-portable object code which is executed by a virtual machine on the computer system. This invention enables computer-aided design tools to operate in an identical manner on any computer system having a virtual machine with design information exchanged therebetween in a machine-independent manner.

30 Claims, 4 Drawing Sheets

COMPUTER SYSTEM AND METHOD FOR PERFORMING DESIGN AUTOMATION IN A DISTRIBUTED COMPUTING ENVIRONMENT

BACKGROUND OF THE INVENTION

This invention relates generally to computer-assisted design automation and more particularly to a computer system and method for performing design automation in a distributed computing environment.

The field of computer-aided design ("CAD") automation has become a valuable, indeed indispensable, part of modern engineering practice. In the high technology industry, electronic design automation ("EDA") and manufacturing computer-aided design ("MCAD") tools are employed during nearly every stage of product design and development. In particular, EDA tools are applied in design levels which include electronic system, circuit board, integrated circuit ("IC") and discrete component levels, and are used in the design of digital, analog, mixed signal and other types of electronic systems.

As an example, EDA systems, also referred to as design or "point" tools, are used extensively during the physical design process. These tools have increased the level of integration, reduced turnaround time and enhanced chip performance. Various point tools accomplish different objectives and different point tools are often required to complete even a single design stage. Point tools are used for numerous tasks, including determining an optimal arrangement of devices in a planar or three-dimensional space, finding efficient interconnection or "routing" schemes and minimizing the amount of space or chip area used.

During the course of a single physical design effort, each point tool will be used repeatedly until a final design is achieved. However, different tools are often supplied by different vendors which introduces several problems. First, each point tool may employ proprietary data structures or protocols unique to that vendor. Second, a particular point tool might be closely tied to the vagaries of the operating system or hardware platform upon which it operates. Third, the suite of point tools used in a single design effort might be distributed over a network of heterogenous computer systems, thereby introducing yet another layer of potential incompatibilities. Each of these problems will now be expanded.

First, the different data structures and protocols for storing and exchanging design information typically used by point tools provided by individual software vendors are often proprietary. Moreover, such point tools generally work independently and lack multi-threading capabilities for dynamically communicating with another point tool while performing a given task. Some point tools, however, share a limited ability to work cooperatively in the context of a particular proprietary modeling environment. One example of such an environment is the Cadence Connection Program, a third party computer-aided design standard developed and distributed by Cadence Design Systems, Inc., San Jose, Calif., which enables data interchange and program cooperation between commercial point tool software from specifically licensed vendors. This approach, while providing a modicum of integration and compatibility, is cumbersome, expensive and inflexible as each point tool must be customized to work in conjunction with the Cadence Connection Program. Moreover, no support for multi-threading or dynamic cooperation is provided.

Second, point tools often operate on different hardware platforms running different operating systems. Each point tool must be rewritten or ported to operate with each operating system and hardware platform on which it is to be used. While it is possible to provide interoperability between these tools in an operating system or hardware platform independent manner, important design information can be lost, for instance, due to semantic flattening, in an attempt to bridge inconsistent data structures and protocols. As a practical matter, most point tools barely interoperate, if at all, because of these problems. This can exacerbate the design process as each point tool must begin and complete its assigned task before the next tool can start. Moreover, there is essentially no "feedback" between the point tools to communicate, for instance, a failure to achieve an optimal end result. If the work in process does not converge to a solution at all, adjustments must be made and the entire process, involving each of the point tools running under their specific operating system and hardware platform, started over.

Third, a closely related concern occurs when point tools are distributed over a network of heterogeneous computers. The transfer of design information in a networked environment is limited by the services and protocols available to the underlying operating system. These include, for example, a data interchange protocol such as the File Transfer Protocol ("FTP"). The non-availability of such network services severely hampers the exchange of information between independent hardware platforms and thereby hinders the design process.

Therefore, there is a need for a computer system and method for performing design automation, including EDA, with complete integration of data structures and protocols. Such a system and method would preferably operate on a variety of hardware platforms running different operating systems. In addition, these hardware platforms could be configured as a distributed environment of heterogenous computers interconnected over a network.

SUMMARY OF THE INVENTION

It is, therefore, an object of the present invention to provide means for specific point tools to exchange and share design information without requiring custom programming. According to the invention, this is accomplished by providing a hardware-independent and operating system-independent computer-aided design operating system preferably expressed in machine-independent object code. Data structures and their methods are encapsulated in a class library for use in exchanging design information between heterogenous computers in a distributed computing environment.

An embodiment of the invention comprises a system, method and storage medium embodying machine-code usable by a computer system for performing computer-aided design. The computer comprises a central processing unit, a memory and a user interface. A design tool, which executes on the computer, generates design information responsive to input data. An operating system, which also executes on the computer, manages hardware resources including the central processing unit and the memory. An interface, which also executes on the computer, interfaces the design tool and the operating system by hiding implementation details specific to the operating system and the hardware resources from the design tool and maintaining the design information in a generic format usable by other design tools.

A further embodiment of the invention comprises a machine-independent operating environment, method and storage medium embodying machine-code usable by a computer system for exchanging design information between a plurality of computer-aided design tools running on a computer system. A set of data format objects is provided for exchanging the design information between each computer aided-design tool. An accessing method is provided for enabling each computer-aided design tool to store design information into and retrieve design information from an associated data format object. An archiving method is provided for enabling the computer system to write the data format objects storing the design information onto and read the data format objects from a storage device interconnected with the computer system.

Still a further embodiment of the invention is a system for interfacing a plurality of computer-aided design tools operating on a computer. An application layer executes the computer-aided design tools in a machine-independent manner. A machine layer manages resources on the computer in a machine-dependent manner relating to both an operating system running on the computer and hardware installed in the computer. An interface layer is logically situated between the application layer and the machine layer over which design information can be communicated between the computer-aided design tools.

Preferably, each computer-aided design tool is expressed in machine-portable object code which is executed by a virtual machine on the computer system. This invention enables computer-aided design tools to operate in an identical manner on any computer system having a virtual machine with design information exchanged therebetween in a machine-independent manner.

The foregoing and other objects, features and advantages of the invention will become more readily apparent from the following detailed description of a preferred embodiment of the invention which proceeds with reference to the accompanying drawings.

DETAILED DESCRIPTION

Figure 1:
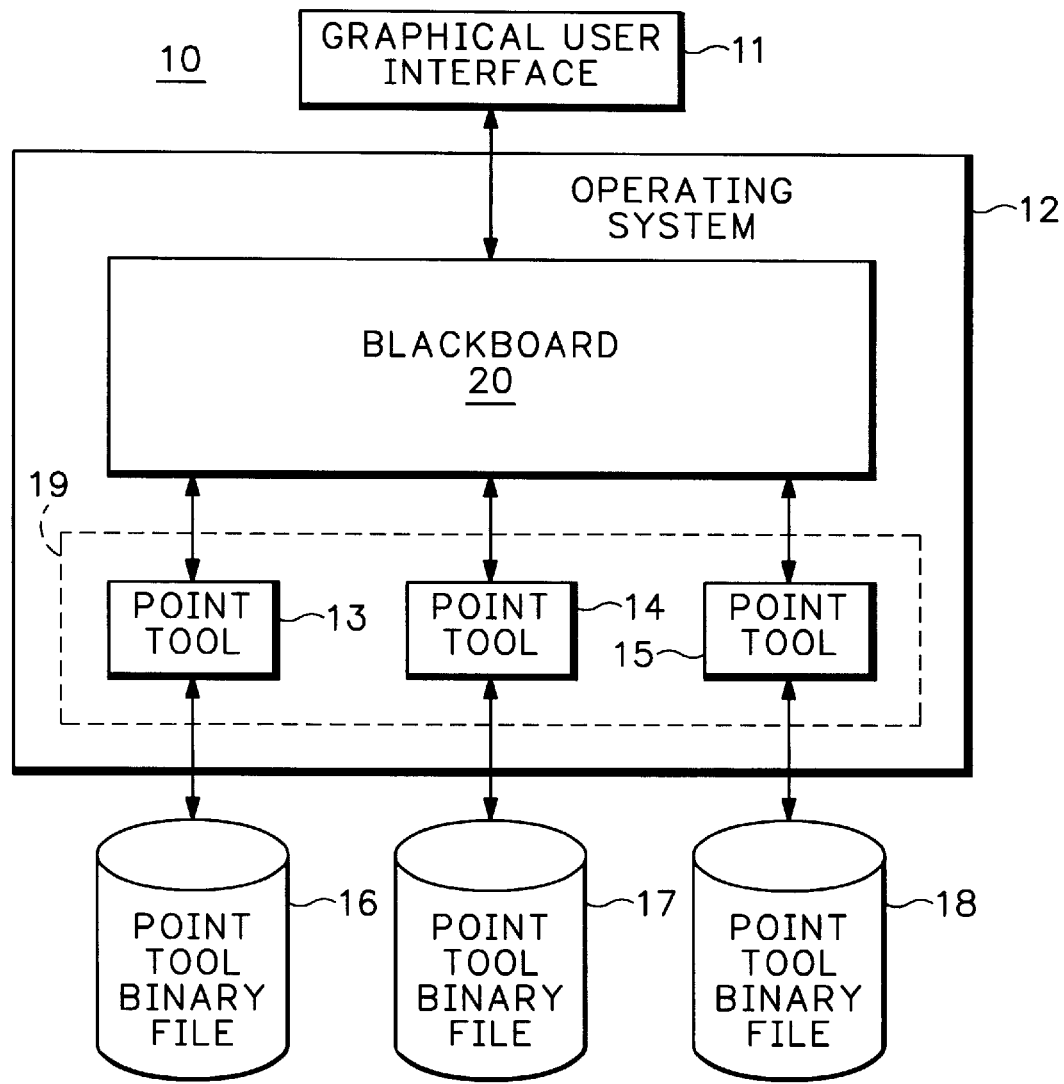
FIG. 1 is a functional block diagram of a prior art computer-aided design ("CAD") system.

Referring to FIG. 1, a functional block diagram of a prior art computer-aided design ("CAD") system 10 as deployed on an engineering workstation is shown. An example of such a workstation is a Sun Workstation, manufactured by Sun Microsystems Inc., Mountain View, Calif., and running a variant of the UNIX®, operating system. UNIX® is a registered trademark of AT&T. A graphical user interface 11 enables a designer to submit commands to the system 10 using an input device (not shown), such as a keyboard, and receive results from the system 10 using a display device (not shown), such as a monitor. An operating system 12, such as the UNIX® operating system, provides an interface to the underlying workstation hardware (not shown). In response to user commands, various point tools 13, 14, 15 stored in secondary storage (not shown) are respectively loaded into the system 10 from point tool binary files 16, 17, 18. Each point tool binary file contains machine-dependent, native object code (not shown) for execution by the microprocessor (not shown) controlling the underlying workstation hardware (shown in FIG. 2). Each of the point tools 13, 14, 15 are written specifically to interface with the particular operating system 12 used by the workstation. The point tools 13, 14, 15 can include, for example, a floor planning and placement point tool, a routing tool or a circuit simulator. Optionally, the point tools 13, 14, 15 may be part of a common computer-aided design tool modeling or framework environment 19, such as the Cadence Framework environment.

Computer-assisted design is largely a serial, incremental process in which each point tool further processes the design information provided by another point tool. For example, routing cannot be determined until floor planning is completed. Thus, it becomes necessary for the point tools 13, 14, 15 to transfer design information between one another as files or via a commonly accessible area of shared memory. One prior art technique for design information interchange involves passing information between successive point tools using a file exchange protocol. The design information is stored into a file on a storage device using a format known to both the storing and retrieving point tools. The difficulty with this approach comes from a phenomenon known as "semantic flattening" wherein contextual information is lost in the transaction. This can happen, for instance, when a storing point tool supports certain features not supported or supported in an incompatible manner by the retrieving point tool. Another example is the loss of contextual information pertinent to an earlier stage of the design process but not carried forward in a data structure to a later stage. There is a lack of inheritance from earlier stages to later stages. As a consequence, semantic flattening causes unavoidable contextual and actual data loss.

A related prior art technique for design information interchange uses a "blackboard" 20 which is simply a special area of shared memory or, alternatively a database, accessible by appropriate point tools. Each point tool 13, 14, 15 can exchange design information via the blackboard 20, but only if each participating point tool conforms to the data structuring conventions and interfacing protocols employed by such point tools 13, 14, 15 for use with that particular blackboard 20. Moreover, the blackboard 20 is often operating-system dependent and is not immune from the effects of semantic flattening.

Figure 2:
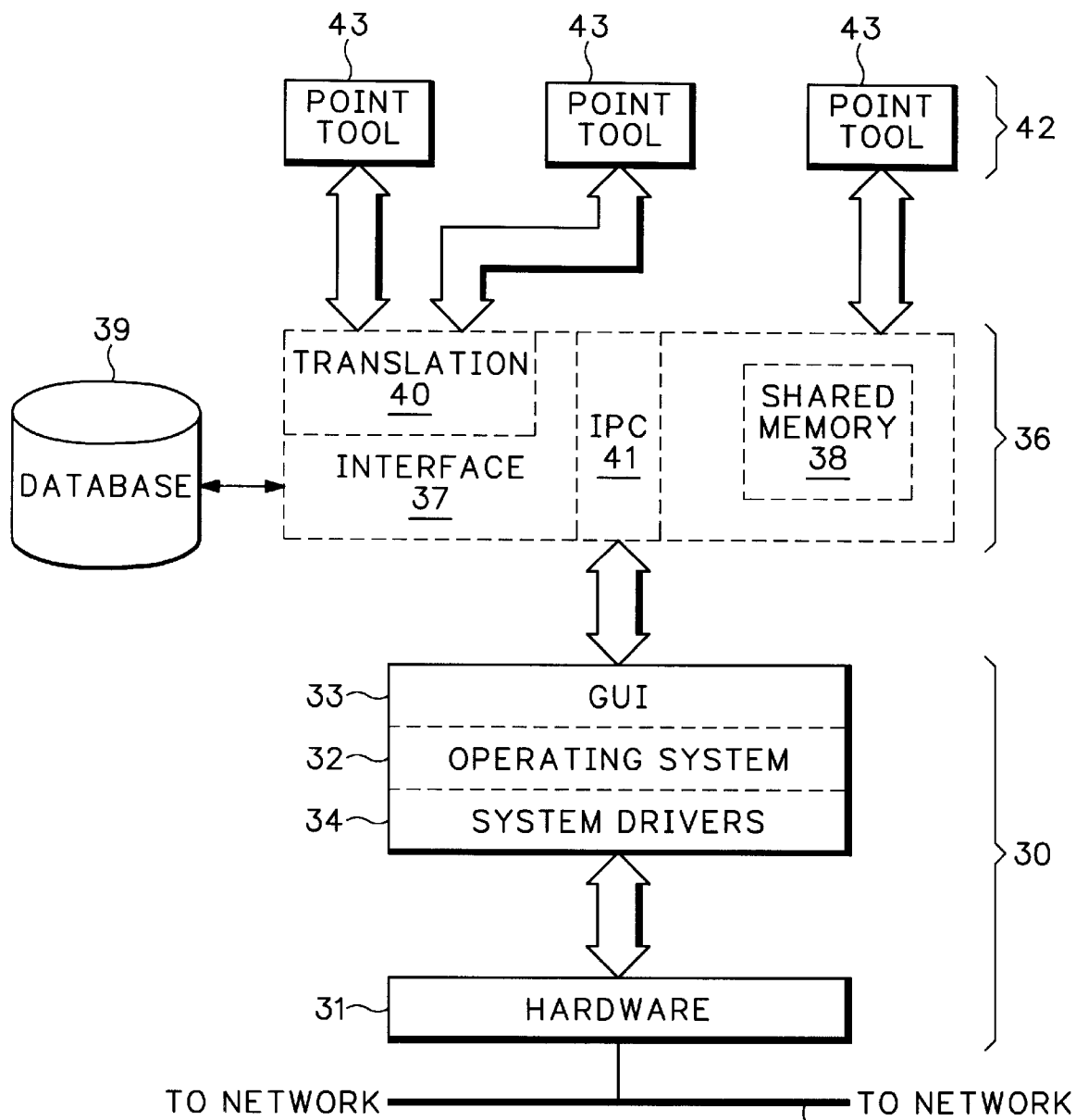
FIG. 2 is a functional block diagram of a prior art environment used by CAD systems.

Referring to FIG. 2, a functional block diagram of a prior art environment used by CAD systems is shown. Present EDA systems architectures can be viewed as comprising essentially three layers. First is a system layer 30 comprising the underlying workstation hardware 31 and operating system 32. Its purpose is to provide a foundation upon which point tools operate. The hardware 31 provides the physical platform for point tool execution and network interconnections. The operating system 32 provides resource management, networking, file system and other conventional operating system 32 services. In addition, the system layer 30 can include a graphical user interface 33, such as the Motif environment, X-Windows or a text-based UNIX® operating system environment which would include system drivers 34 for interfacing with the hardware 31 platform. As common in engineering environments, the workstation can be interconnected with other workstations or file servers over a network 35.

Second is an interface layer 36 which provides a virtual interface 37 between the point tools 43 and the system layer 30. Its purpose is to provide a channel for moving design information and other data between point tools 43, either in the sense of communicating or transferring design information directly between peer point tools 43 via a shared memory space 38, or making the design information available to other point tools 43 using a common database 39. One example of such an interface is the blackboard 20 (shown in FIG. 1). In addition, this layer may provide translation data services 40 or rely on interprocess communication ("IPC") protocols 41 for interacting with system resources, helper applications or peer point tools 43. Unfortunately, due to the large variations in hardware 31, operating system 32 and point tool 43 combinations, there is no standard interface layer in today's EDA environment. The interface layer 36 also comprises a mix of data structures (not shown) implicit in the shared memory space 38 and the database 39 for sharing design information among various point tools 43. Most of these data structures and protocols are point tool-specific or vendor-proprietary.

Last is an application layer 42 comprising the point tools 43 (shown as point tools 13, 14, 15 in FIG. 1) themselves. There are scores of different point tools 43 commercially available, most of which have their own proprietary data structures and methods of data representation. In general, these applications are not readily "portable" between workstations from different vendors. Moreover, each point tool 43 is specifically programmed or "hard-wired" to interface with the database structures in interface layer 36.

Typically, the point tools 43 are not interoperable with each other except in a limited way and the data used and generated by the various point tools 43 often get semantically flattened if it is exchanged at all. Even the sizes of the data structures which they use can vary based on machine word size. Due to these vendor-specific variations, the interface layer 36 must be tailored to work with these specific variations. Consequently, the interface layer 36 for each configuration is dependent both on the one hand to work with the underlying operating system 32 and hardware 31 and on the other hand for accommodating a given set of point tools 43. All of these different permutations and combinations of software are expensive to build and maintain. Moreover, once a stable and useful system is constructed, it is often difficult to substitute or upgrade any given component in light of potential incompatibility issues. Even when some level of compatibility is achieved, perhaps by using a blackboard 20, the problem of semantic flattening severely limits the effectiveness of the overall system.

Figure 3:
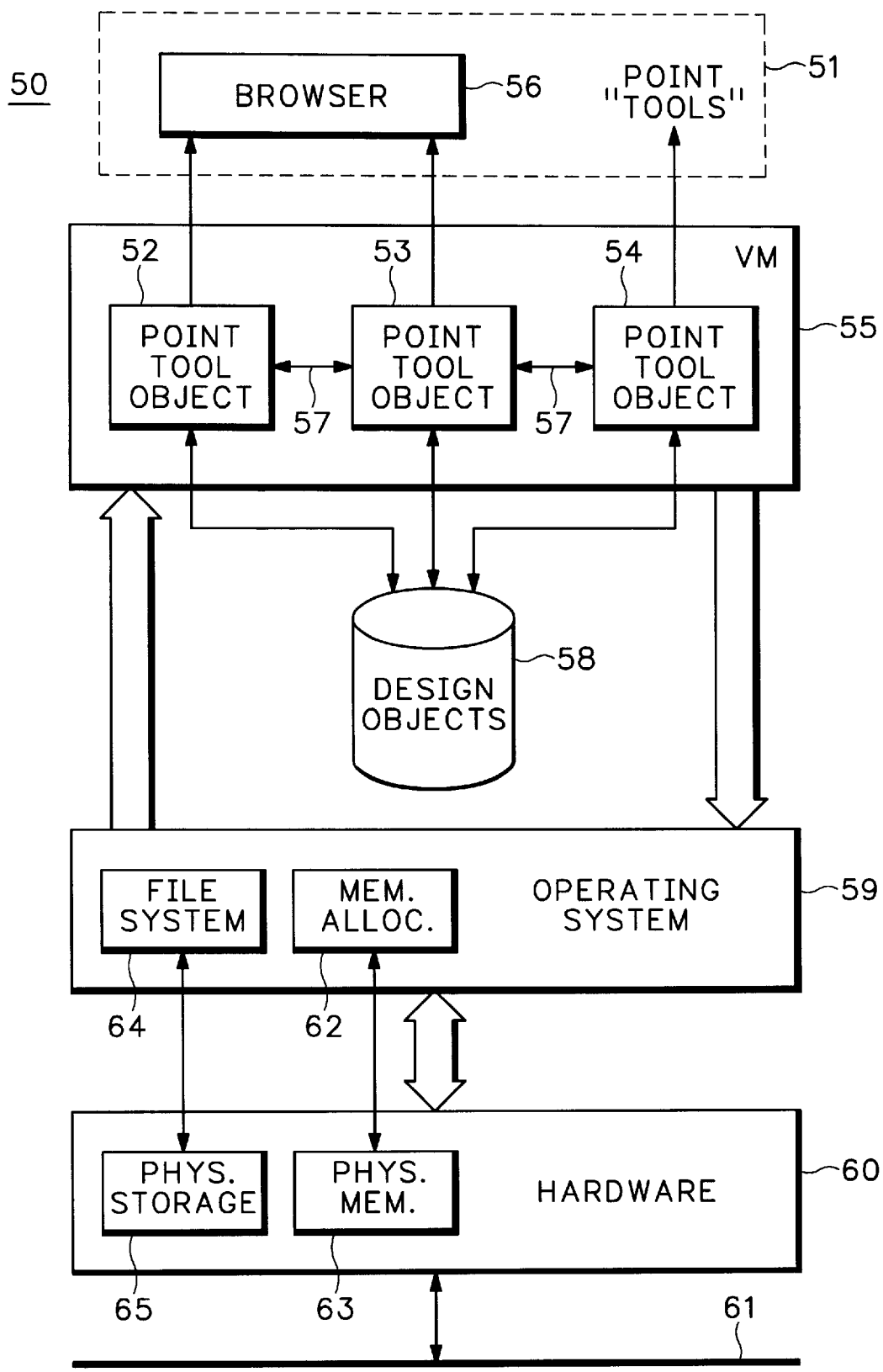
FIG. 3 is functional block diagram of an individual workstation configured in accordance with the present invention.

Referring to FIG. 3, a functional block diagram of an individual workstation 50 configured in accordance with the present invention is shown. Point tools 51 (shown as point tools 43 in FIG. 2) are expressed as point tool objects 52, 53, 54. Each point tool object is a self-contained module for performing a well-defined set of CAD functions and is written in machine-independent object code, as further described hereinbelow. Optionally, a browser 56 can be employed by the workstation 50 to provide a uniform user interface for a plurality of point tools by interfacing to individual point tool objects, such as point tool objects 52 and 53, as "plug-in" modules. In other words, these browser-enabled point tool objects omit the stand-alone object code, and hence, the incompatibilities, for providing operating system-dependent or hardware-specific user interfaces. Alternatively, a point tool object, such as point tool object 54, can include its own user interface. Moreover, a point tool object could be written for browser-based use, stand-alone operation or a combination of both. Optionally, the point tool objects 52, 53, 54 can be bundled into a class library.

The point tool objects 52, 53, 54 are executed by virtual machine 55. This "machine" logically creates an interface layer between the application programs, such as point tool objects 52, 53, 54, and the underlying operating system 59 and hardware 60. The virtual machine 55 defines a set of application programming interfaces (APIs) between the respective point tool objects 52, 53, 54 and the virtual machine 55 and between the virtual machine 55 and the underlying operating system 59 and hardware 60. The virtual machine 55 provides various services in an operating system- and hardware-independent manner, for example, extension classes for network interfacing and graphics. It replaces the underlying operating system 59 and hardware 60 as a "surrogate" operating system. These services include accessing methods for enabling each point tool object 52, 53, 54 to store and retrieve design information as design objects 58 (further described hereinbelow) and archiving methods for enabling the underlying operating system 59 and hardware 60 to write design objects 58 onto and read design objects 58 from physical memory 63 and physical storage 65. The virtual machine 55 also provides generic software drivers (not shown) for interfacing to the hardware 60.

Additionally, the virtual machine 55 enables peer point tools to coordinate their activities or to spawn new "child" activities via interprocess control threads 57. Moreover, the peer or child point tool objects can execute on the same or on a remote workstation over a network 61. The remote workstation can be located in a distributed computing environment, such as a local area network, intranetwork or internetwork, as further described hereinbelow with reference to FIG. 4. By contrast, threads as used in the prior art were operating system dependent and generally restricted to execution on the immediate workstation.

Finally, the virtual machine 55 also provides memory management, including shared memory, and file system services. Ordinarily, the operating system 59 handles memory management chores by interfacing memory allocation requests 62 to physical memory 63 in the hardware 60. Likewise, the operating system 59 handles file system operations by managing a file system 64 physically located on physical storage 65 in the hardware 60. The virtual machine 55 provides its own set of memory allocation and file system services to the point tool objects 52, 53, 54. Thus, the machine-dependent and operating system-dependent mechanisms for allocating memory and interacting with the file system are made transparent and uniform to all point tool objects.

Design information is exchanged between point tool objects 52, 53, 54 using design objects 58, as further described herein below with reference to FIG. 5. Each design object 58 incorporates a structural hierarchy representing the physical and abstract design components and their associated attributes which is encapsulated as data format objects. The design objects 58 are stored in a manner that is independent of any particular operating system or hardware-related dependencies. The design objects 58 are a functional part of the virtual machine 55 which maintains the design information using the design objects 58 in a generic format usable by workstation environments.

In the described embodiment, the concept of stand-alone design tools is eliminated in favor of point tool objects which interface to each other in a plug-in and hierarchical manner. Preferably, each point tool object 52, 53, 54 is written in a machine-independent, object-oriented programming language, but distributed as machine-portable object code. An example of a suitable programming language is the Java™ programming language. Java™ is a trademark of Sun Microsystems, Inc. Mountain View, Calif. The machine-portable object code is known as byte code in Java™. In addition, the virtual machine 55 provides a machine-independent operating environment and functions as either an interpreter or on-the-fly compiler for the point tool objects 52, 53, 54.

Figure 4:
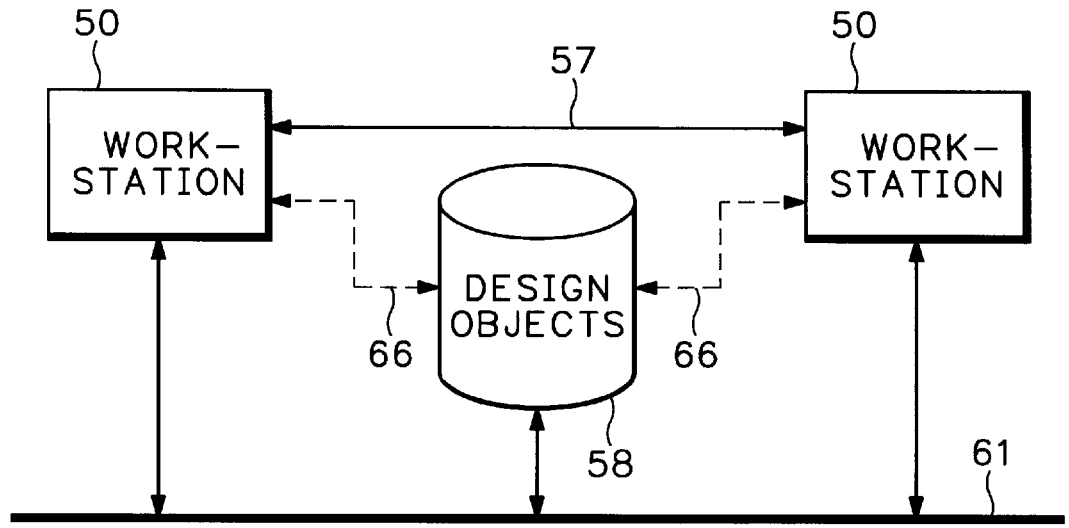
FIG. 4 is a block diagram of a distributed computing environment incorporating the workstation of FIG. 3.

Referring to FIG. 4, a block diagram of a distributed computing environment incorporating the workstation 50 of FIG. 3 is shown. A pair of workstations 50 and a repository of design objects 58 are interconnected via the network 61. The design object repository may be co-located on a workstation 50 which includes point tools 55 or stand-alone. The network 61 can be a local area network, intranetwork or internetwork. Virtual machines (not shown) run on each workstation 50 and on the design object repository 58 and provide the necessary translation and network accessing services over which the individual workstations 50 create virtual connections 66 to the design objects 58. Also, a peer or child process can be spawned on one of the workstations 50 for execution via a thread 57 on the other workstation 50 over the network 61. The design object repository 58 can be organized into a shared memory space or into a database using the virtual machine 55. Preferably, each design object is written in the same machine-independent object code as the point tool objects.

Figure 5:
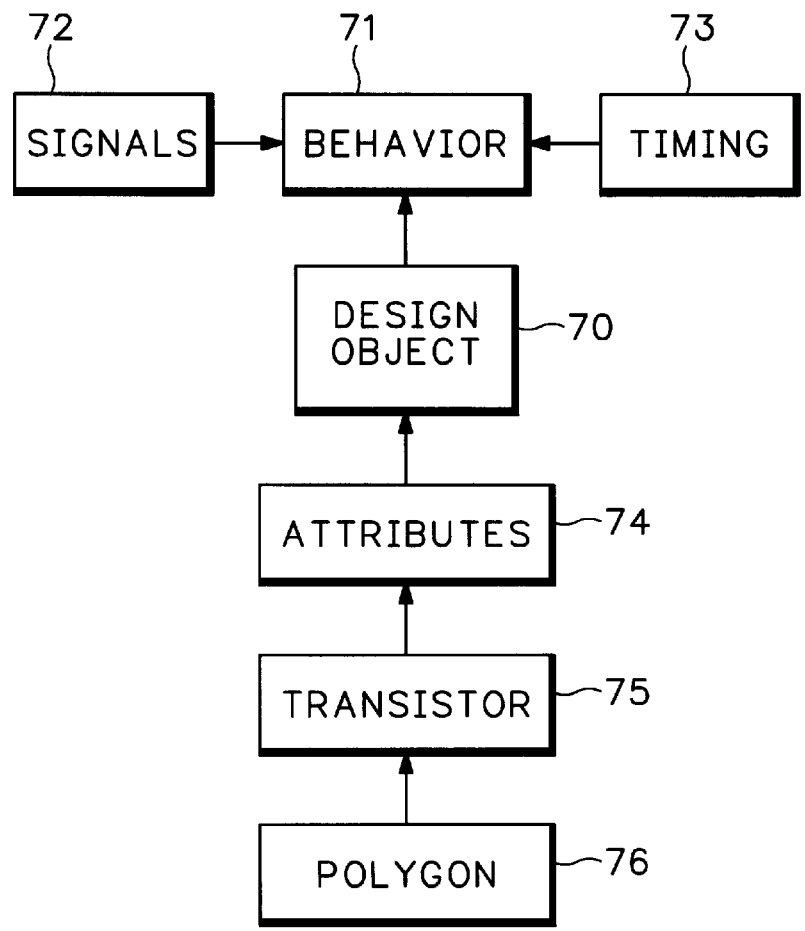
FIG. 5 shows, by way of example, a design object used by the workstation of FIG. 3.

Referring to FIG. 5, a block diagram showing, by way of example, a single design object 70 is shown. The design object 70 is a composite data structure incorporating a hierarchical structuring of design information as used by each of the point tool objects 52, 53, 54. In the prior art, design information was stored in simple data structures which imposed a flat organization to the information contained therein. Consequently, these prior art data structures were incapable of representing the various levels of information inherent in a single design object, such as a logic gate. For instance, to properly describe each of the hierarchical levels of abstraction relating to a single logic gate, the data structure must be able to describe how the logic gate performs its several logic functions, defines its physical pins, notate the required timing and power constraints, indicate where on a physical semiconductor wafer it can be implemented, list the individual logic gates it needs, record its physical design or layout, and describe any layering considerations. In short, the prior art data structures lost the context in which a single design object was used.

The design object 70 of the present invention solves these problems by providing a complex data type known as a design object which can mirror these hierarchial levels of abstraction and thereby capture the context of the device being represented through inheritance. This is possible because each design object 70 is an object of the virtual machine 55 which provides the necessary storage enforcement mechanisms for ensuring that a compliant hierarchial organization is maintained.

Design object 70 shows, by way of example, a design object representing a simple logic gate. It contains a specific instance of a behavior object 71 and an attributes object 74. The behavior object 71 indicates the highest level of abstraction for a logic gate. The design object 70 is treated as a "black box" representing the simple logic gate. This gate is interconnected to other black boxes representing, for instance, other logic gates, via a signals object 72. It is also subject to the timing constraints contained in a timing object 73. The behavior of the simple logic gate, which is stored as part of the behavior object 71, can be modeled in conventional programming language or hardware description language source code, such as microcode.

The attributes object 74 contains fabrication-related properties, such as surface area, speed, power and physical makeup. In turn, the attributes object 74 contains a specific instance of a transistor object 75 which in turn contains a specific instance of a polygon object 76. The transistor object 75 contains the structure for interconnecting several transistors into a logic gate and their respective parameters.

The polygon object 76 describes the specific layout of the gate in physical terms. As a further example of a design object, consider a central processing unit (CPU). At the behavioral level, the CPU can be viewed as a black box interconnected via signals and buses to other black boxes. These other black boxes might represent, for instance, a memory or an input/output interface, and are modeled as separate design objects. The behavior of the CPU can be modeled using a programming language or the hardware description language and each of the other black boxes will likewise have some behavioral model. At the next level of abstraction, the attributes of each of the black boxes is defined as design objects. The CPU might be subdivided into modules representing an arithmetic logic unit, a bank of registers, a control section and a data path. In addition, each module will comprise an interface for interconnecting to other modules either on the CPU itself or external to it. Each interface will in turn be further defined in terms of signal and attribute design objects. At the next level of abstraction, the individual modules can be modeled in terms of their component makeup, for instance, by a net list which can be used by a synthesizer for fabricating a logic circuit. At the lowest level of abstraction, each component will be represented in terms of physical hardware components, such as transistors and wire paths. The hierarchical nature of design objects enables the full context of a component, such as a CPU, to be communicated to other point tools regardless of location or implementation.

By employing a virtual machine to create a machine-independent operating environment, a designer can access a design object from any point tool object, co-process with another point tool object or spawn a child point tool object. Moreover, a designer is able to work at any desired level of abstraction without the added complication of needing to search out the necessary detail for the component of interest. During the design process, the designer can employ any workstation regardless of operating system or hardware configuration or location. The virtual machine enables a point tool to access a required design object in a heterogenous distributing environment. Consequently, the design can be revised and iteratively refined using a selection of point tool objects until a satisfactory design has been realized.

Having described and illustrated the principles of the invention in a preferred embodiment thereof, it should be apparent that the invention can be modified in arrangement and detail without departing from such principles. We claim all modifications and variations coming within the spirit and scope of the following claims:

1. A system using a computer for performing computer-aided design, the computer comprising a central processing unit and a memory, and the system comprising:
   a design tool, executing on the computer, for generating design information responsive to input data, the design tool being expressed in machine-portable object code;
   an operating system, executing on the computer, for managing hardware resources including the central processing unit and the memory; and
   a software interface layer executing on the computer, the software interface layer including means for the design tool to access the operating system and the hardware resources in an implementation-independent manner and further including means for archiving the design information in software objects that use a generic format usable by other design tools, each software object having an identifier and providing space for storing the design information;

the interface layer further including:

predetermined software methods associated with the software objects for managing the design information, the design tool invoking each such methods as needed to store, access and destroy the design information; and virtual machine software means for executing the machine-portable object code.

2. A system according to claim 1, further comprising:

a class library for maintaining the objects and the methods for use by other design tools.

3. A system according to claim 1, wherein the executing means is an interpreter.

4. A system according to claim 1, wherein the executing means is a dynamic compiler.

5. A system according to claim 1, further comprising:

means for organizing the design information in the generic format using a commonly shared storage space accessible by the other design tools.

6. A system according to claim 5, wherein the organizing means is a database.

7. A system according to claim 5, wherein the organizing means is shared memory space.

8. A method using a computer for performing computer-aided design, comprising the steps of:

generating design information using a computer-aided design tool executing on the computer responsive to input data, each computer-aided design tool being expressed in machine-portable object code;

managing hardware resources including a central processing unit and a memory using an operating system executing on the computer; and interfacing the design tool and the operating system, including accessing the operating system and the hardware resources, in an implementation-independent manner using the design tool; and archiving the design information in a generic format usable by other design tools using the operating system and the hardware resources;

the interfacing step using a virtual machine for executing the machine-portable object code on the computer system utilizing the data format objects.

9. A method according to claim 8, wherein the step of interfacing further comprises the steps of:

maintaining the design information in the generic format in design objects, each design object having an identifier and providing space for storing the design information; and associating methods with the design objects for managing the design information, the design tool invoking each such method to store, access and destroy the design information.

10. A method according to claim 9, further comprising the step of:

maintaining a class library of the objects and the methods for use by other design tools.

11. A method according to claim 8, further comprising the step of expressing the design tool in machine-portable object code, the step of interfacing further comprising the step of executing the machine-portable object code.

12. A method according to claim 11, wherein the step of executing further comprises interpreting the machine-portable object code using an interpreter.

13. A method according to claim 11, wherein the step of executing further comprises interpreting the machine-portable object code using a dynamic compiler.

14. A method according to claim 8, further comprising the step of organizing the design information in the generic format using a commonly shared storage space accessible by the other design tools.

15. A storage medium embodying machine-readable code usable on a computer for performing computer-aided design, comprising:

means for generating design information using a design tool executing on the computer responsive to input data, each computer-aided design tool being expressed in machine-portable object code;

means for managing hardware resources including a central processing unit and a memory using an operating system executing on the computer;

means for interfacing the design tool and the operating system, including means for accessing the operating system and the hardware resources in an implementation-independent manner using the design tool;

means for archiving the design information in a generic format usable by other design tools using the operating system and the hardware resources; and a virtual machine for executing the machine-portable object code on the computer system utilizing the data format objects.

16. A machine-independent operating environment for exchanging design information between a plurality of computer-aided design tools running on a computer system, comprising:

a set of data format objects for exchanging the design information between each computer aided-design tool;

each computer-aided design tool being expressed in machine-portable object code;

an accessing means for enabling each computer-aided design tool to store the design information into and retrieve the design information from an associated data format object;

an archiving means for enabling the computer system to write the data format objects storing the design information onto and read the data format objects storing the design information from a storage device interconnected with the computer system; and a virtual machine for executing the machine-portable object code on the computer system utilizing the data format objects.

17. A machine-independent operating environment according to claim 16, wherein the computer-aided design tools run on separate such computer systems interconnected over a distributed computing network.

18. A machine-independent operating environment according to claim 17, wherein the separate computer systems are heterogenous computer systems.

19. A machine-independent operating environment according to claim 16, wherein the set of data format objects, the accessing method and the archiving method combine to form a computer-aided design tool operating system.

20. A machine-independent operating environment according to claim 16, wherein the computer-aided design tools share the design information using shared memory space, the archiving method further comprising means for allocating the shared memory space from a memory interconnected with the computer system and the accessing method further comprises means for communicating the data format objects storing the design information via the shared memory space with each computer-aided design tool.

21. A machine-independent operating environment according to claim 16, wherein the computer-aided design tools share the design information using a database, the archiving method further comprising means for maintaining the database on the storage device and the accessing method further comprises means for communicating the data format objects storing the design information using the database with each computer-aided design tool.

22. A method for exchanging design information between a plurality of computer-aided design tools running on a computer system in a machine-independent operating environment, comprising the steps of:

exchanging a set of data format objects containing the design information between each computer aided-design tool, each computer-aided design tool being expressed in machine-portable object code;

storing the design information into and retrieving the design information from an associated data format object using an accessing method with each computer-aided design tool;

writing the data format objects storing the design information onto and reading the data format objects storing the design information from a storage device interconnected with the computer system using an archiving method with the computer system; and interfacing the design tool and the operating system, including accessing the operating system and the hardware resources in an implementation-independent manner using the design tool and a virtual machine for executing the machine-portable object code on the computer system utilizing the data format objects.

23. A method according to claim 22, further comprising the steps of:

expressing each computer-aided design tool in machine-portable object code; and executing the machine-portable object code using a virtual machine on the computer system.

24. A method according to claim 22, further comprising the steps of:

sharing the design information between the computer-aided design tools using shared memory space;

allocating the shared memory space from a memory interconnected with the computer system; and communicating the data format objects storing the design information via the shared memory space with each computer-aided design tool.

25. A method according to claim 22, further comprising the steps of:

sharing the design information between the computer-aided design tools using a database;

maintaining the database on the storage device; and communicating the data format objects storing the design information using the database with each computer-aided design tool.

26. A storage medium embodying machine-readable code usable on a computer system for exchanging design information between a plurality of computer-aided design tools in a machine-independent operating environment, comprising:

means for exchanging a set of data format objects containing the design information between each computer aided-design tool, each computer-aided design tool being expressed in machine-portable object code;

means for storing the design information into and retrieving the design information from an associated data format object using an accessing method with each computer-aided design tool;

means for writing the data format objects storing the design information onto and reading the data format objects storing the design information from a storage device interconnected with the computer system using an archiving method with the computer system; and means for interfacing the design tool and the operating system, including means for accessing the operating system and the hardware resources in an implementation-independent manner using the design tool and a virtual machine for executing the machine-portable object code on the computer system utilizing the data format objects.

27. A system for interfacing a plurality of computer-aided design tools operating on a computer, comprising:

an application layer for executing the computer-aided design tools in a machine-independent manner, each computer-aided design tool being expressed in machine-portable object code;

a machine layer for managing resources on the computer in a machine-dependent manner relating to both an operating system running on the computer and hardware installed in the computer; and an interface layer logically situated between the application layer and the machine layer over which design information is communicated between the computer-aided design tools.

the interface layer including a virtual machine for executing the machine-portable object code on the computer system utilizing the data format objects.

28. A system according to claim 27, further comprising:

a set of application interfaces for communication between the application layer and the interface layer; and a set of machine interfaces for communication between the interface layer and the machine layer.

29. A system according to claim 27, wherein the set of application interfaces further comprises:

a downward interface set for sending design information from the application layer to the interface layer; and an upward interface set for sending design information from the interface layer to the application layer.

30. A system according to claim 27, wherein the set of machine interfaces further comprises:

a downward interface set for sending design information from the interface layer to the machine layer; and an upward interface set for sending design information from machine layer to the interface layer.

* * * * *